United States Patent
Kim et al.

(10) Patent No.: US 8,754,515 B2
(45) Date of Patent: Jun. 17, 2014

(54) STACKED PACKAGES HAVING THROUGH HOLE VIAS

(75) Inventors: Tae-Hun Kim, Cheonan-si (KR); Jin-Woo Park, Seoul (KR); Dae-Young Choi, Yeosu-si (KR); Mi-Yeon Kim, Asan-si (KR); Sun-Hye Lee, Cheongju-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/614,931

(22) Filed: Sep. 13, 2012

(65) Prior Publication Data
US 2013/0001800 A1    Jan. 3, 2013

Related U.S. Application Data

(62) Division of application No. 13/027,511, filed on Feb. 15, 2011, now Pat. No. 8,293,580.

(30) Foreign Application Priority Data

Mar. 24, 2010 (KR) .......... 10-2010-0026393

(51) Int. Cl.
| H01L 23/02 | (2006.01) |
| H01L 21/00 | (2006.01) |
| H01L 25/065 | (2006.01) |
| H01L 25/10 | (2006.01) |
| H01L 25/00 | (2006.01) |
| H01L 21/78 | (2006.01) |
| H01L 23/48 | (2006.01) |
| H01L 23/00 | (2006.01) |
| H01L 23/31 | (2006.01) |

(52) U.S. Cl.
CPC .......... *H01L 25/0657* (2013.01); *H01L 25/105* (2013.01); *H01L 25/50* (2013.01); *H01L 21/78* (2013.01); *H01L 23/481* (2013.01); *H01L 24/81* (2013.01); *H01L 24/97* (2013.01); *H01L 23/3128* (2013.01)
USPC .......... 257/686; 257/687; 257/724; 257/777; 257/787; 257/E21.602; 257/E23.085; 438/113; 438/460

(58) Field of Classification Search
CPC ... H01L 25/0657; H01L 25/105; H01L 25/50; H01L 21/78; H01L 21/768; H01L 23/3128; H01L 23/488; H01L 24/81; H01L 24/97
USPC ................ 257/685–687, 723, 724, 777, 787; 438/107–110, 113, 125, 460, 462
See application file for complete search history.

(56) References Cited

U.S. PATENT DOCUMENTS

| 7,288,841 B2 | 10/2007 | Yamano |
| 7,598,617 B2 | 10/2009 | Lee et al. |

(Continued)

FOREIGN PATENT DOCUMENTS

| JP | 2006-351565 | 12/2006 |
| KR | 10-2006-0129949 | 12/2006 |
| KR | 10-2009-0074494 | 7/2009 |

*Primary Examiner* — Alonzo Chambliss
(74) *Attorney, Agent, or Firm* — Harness, Dickey & Pierce, P.L.C.

(57) ABSTRACT

Provided is a method of forming a package-on-package. An encapsulation is formed to cover a wafer using a wafer level molding process. The wafer includes a plurality of semiconductor chips and a plurality of through silicon vias (TSVs) passing through the semiconductor chips. The encapsulant may have openings aligned with the TSVs. The encapsulant and the semiconductor chips are divided to form a plurality of semiconductor packages. Another semiconductor package is stacked on one selected from the semiconductor packages. The other semiconductor package is electrically connected to the TSVs.

13 Claims, 14 Drawing Sheets

(56) References Cited

U.S. PATENT DOCUMENTS

| | | |
|---|---|---|
| 7,829,975 B2 | 11/2010 | Hayasaka et al. |
| 7,843,072 B1 | 11/2010 | Park et al. |
| 8,293,580 B2 * | 10/2012 | Kim et al. .................... 438/112 |
| 2005/0046002 A1 | 3/2005 | Lee et al. |
| 2007/0281374 A1 | 12/2007 | Lee et al. |
| 2008/0088031 A1 | 4/2008 | Kwon et al. |
| 2009/0200662 A1 | 8/2009 | Ng et al. |
| 2011/0062574 A1 | 3/2011 | Jang et al. |
| 2011/0127662 A1 * | 6/2011 | Yang et al. .................... 257/686 |
| 2011/0204505 A1 | 8/2011 | Pagaila et al. |

* cited by examiner

2000

STACKED PACKAGES HAVING THROUGH HOLE VIAS

CROSS-REFERENCE TO RELATED APPLICATION

This application is a divisional of and claims priority under 35 U.S.C. §120 and 121 to U.S. application Ser. No. 13/027,511, filed Feb. 15, 2011, which claims priority under 35 U.S.C. §119 to Korean Patent Application No. 10-2010-26393 filed on Mar. 24, 2010, the disclosure of each of which is hereby incorporated by reference in its entirety.

BACKGROUND

1. Field

Example embodiments of the inventive concepts relate to a semiconductor device and a method of forming the same, and more particularly, to a method of forming a package-on-package and a device related thereto.

2. Description of Related Art

As electronic devices have become thinner and smaller-sized, techniques related to a package-on-package (PoP) have been widely researched. The PoP refers to a package in which the same or different kinds of semiconductor packages are stacked to reduce a horizontal mounting surface, increasing the degree of integration thereof. However, it is very difficult to stack the plurality of semiconductor packages while controlling the width and height of the PoP.

SUMMARY

Example embodiments of the inventive concepts provide a method of forming a package-on-package (PoP) capable of easily reducing the width and height of the PoP.

In accordance with an example embodiment of the inventive concepts, a method of forming a semiconductor package may include forming an encapsulant with openings on a wafer using a wafer level molding process, the wafer including a plurality of first semiconductor chips and a plurality of through silicon vias (TSVs) passing through the plurality of first semiconductor chips, dividing the encapsulant and the wafer to form a plurality of first semiconductor packages, the plurality of first semiconductor packages including the plurality of first semiconductor chips, and stacking a second semiconductor package on one first semiconductor package selected from the plurality of first semiconductor packages, wherein the second semiconductor package is electrically connected to the TSVs of the one first semiconductor package via the openings.

In accordance with another example embodiment of the inventive concepts, a method of forming a semiconductor package, may include forming a plurality of through silicon vias (TSVs) through an upper surface of a wafer, the wafer having a plurality of first semiconductor chips, the plurality of TSVs being formed to have lower ends buried in the wafer and upper ends exposed by one surface of the wafer, forming an encapsulant on the wafer using a wafer level molding process, the encapsulant being formed to cover the upper ends of the TSVs, partially removing a lower surface of the wafer to expose the lower ends of the TSVs, forming openings through the encapsulant, the openings being aligned on the upper ends of the TSVs, dividing the encapsulant and the wafer to form a plurality of first semiconductor packages, and stacking a second semiconductor package on a first semiconductor package selected from the plurality of first semiconductor packages, the second semiconductor package being electrically connected to the TSVs.

In accordance with an example embodiment, a method of forming a semiconductor package may include forming a plurality of through silicon vias (TSVs) through an upper surface of a wafer, the wafer having a plurality of semiconductor chips, the plurality of TSVs being formed to have lower ends buried in the wafer and upper ends exposed by the upper surface of the wafer, partially removing a lower surface of the wafer to expose the lower ends of the TSVs, forming an encapsulant on at least one of the upper and lower surfaces of the wafer using a wafer level molding process, forming openings passing through the encapsulant, the openings being aligned with the TSVs, dividing the encapsulant and the wafer to form a plurality of first semiconductor packages, and stacking a second semiconductor package on a first semiconductor package selected from the plurality of first semiconductor packages, wherein the second semiconductor package is electrically connected to the TSVs.

In accordance with an example embodiment of the inventive concepts, a method of forming a semiconductor package may include forming an encapsulant on at least one of an upper and lower surface of a wafer, the wafer including a plurality of first semiconductor chips and a plurality of first through silicon vias, forming a plurality of first openings in the encapsulant, dividing the encapsulant and the wafer to form a first plurality of first semiconductor packages, each of the first semiconductor packages including at least one first semiconductor chip, at least one first opening, and at least one first through silicon via, providing a second semiconductor package including at least one external contact terminal and at least one second semiconductor chip, and mounting the second semiconductor package on one of the first semiconductor packages, wherein mounting the second semiconductor package on the one of the first semiconductor packages includes inserting the at least one external contact terminal into the at least one first opening of the of the one of the first semiconductor packages to electrically connect the at least one second semiconductor chip to the at least one first semiconductor chip of the one of the first semiconductor packages.

In accordance with an example embodiment of the inventive concepts, a semiconductor package may include a first semiconductor package and a second semiconductor package. The first semiconductor package may include a first semiconductor chip having a plurality of through silicon vias extending therethrough and an encapsulant on at least one of an upper surface and a lower surface of the first semiconductor chip. In this example embodiment, the encapsulant may include a plurality of openings corresponding to the plurality of through silicon vias. The second semiconductor package may be on the first semiconductor package and the second semiconductor package may include a second semiconductor chip and a plurality of external connection terminals below the second semiconductor chip. In this example embodiment the plurality of external connection terminals may be inserted into the plurality of openings to electrically connect the first semiconductor chip to the second semiconductor chip.

In accordance with an aspect of the inventive concepts, a method of forming a package-on-package is provided. An encapsulant configured to cover a wafer is formed using a wafer level molding process. The wafer includes a plurality of semiconductor chips, and a plurality of through silicon vias (TSVs) passing through the semiconductor chips. The encapsulant has openings. The encapsulant and the semiconductor chips are divided to form a plurality of semiconductor packages. Another semiconductor package is stacked on one package selected from the semiconductor packages. The other semiconductor package is electrically connected to the TSVs via the openings.

In some example embodiments, the semiconductor packages may have substantially the same width as the semiconductor chips. The other semiconductor package may have a width equal to that of the one package selected from the semiconductor packages, or smaller than that of the one package selected from the semiconductor packages.

In another example embodiment, the other semiconductor package may be another one package selected from the semiconductor packages.

In still another example embodiment, the openings may be aligned with the TSVs.

In yet another example embodiment, the semiconductor chips may include a re-distribution layer (RDL) electrically connected to the TSVs. At least one of the openings may be aligned with the RDL.

In yet another example embodiment, the other semiconductor package may include another semiconductor chip attached to a printed circuit board. The other semiconductor chip may be electrically connected to the TSVs via the printed circuit board. Another package selected from the semiconductor packages may be attached between the one selected package and the other semiconductor package of the semiconductor packages.

In yet another example embodiment, another printed circuit board may be attached to a lower part of one selected from the semiconductor packages. The other printed circuit board may have a width equal to or smaller than that of one selected from the semiconductor packages. The other semiconductor package may be electrically connected to the printed circuit board via the TSVs.

In yet another example embodiment, forming the encapsulant may include forming the TSVs on an upper surface of the wafer, forming the encapsulant on the upper surface of the wafer, and partially removing a lower surface of the wafer to expose the TSVs.

In yet another example embodiment, forming the encapsulant may include forming the TSVs on an upper surface of the wafer, partially removing a lower surface of the wafer to expose the TSVs such that the upper and lower surfaces face each other, and forming the encapsulant on at least one surface of the upper and lower surfaces. The encapsulant may be formed to cover the upper surface and the lower surface.

In yet another example embodiment, connection terminals may be formed on the TSVs. The connection terminals may be one selected from the group consisting of a conductive bump, a solder ball, a conductive spacer, a pin grid array (PGA), a lead grid array (LGA), and a combination thereof.

In accordance with another aspect of the inventive concepts, a method of forming a package-on-package is provided. A plurality of through silicon vias (TSVs) are formed on an upper surface of a wafer having a plurality of semiconductor chips. Lower ends of the TSVs are buried in the wafer. Upper ends of the TSVs are exposed to one surface of the wafer. An encapsulant is formed on the wafer using a wafer level molding process. The encapsulant covers the upper ends of the TSVs. A lower surface of the wafer is partially removed to expose the lower ends of the TSVs. Openings passing through the encapsulant are formed. The openings are aligned on the upper ends of the TSVs. The encapsulant and the wafer are divided to form a plurality of semiconductor packages. Another semiconductor package is stacked on one selected from the semiconductor packages. The other semiconductor package is electrically connected to the TSVs.

In some example embodiments, the semiconductor packages may have substantially the same width as the semiconductor chips. The other semiconductor package may have the width equal to or smaller than that of one selected from the semiconductor packages. Further, the other semiconductor package may have a width larger than that of one selected from the semiconductor packages.

In another example embodiment, before forming the encapsulant, internal connection terminals may be formed at the upper ends of the TSVs. The internal connection terminals may be one selected from the group consisting of a conductive bump, a solder ball, a conductive spacer, a pin grid array (PGA), a lead grid array (LGA), and a combination thereof.

In still another example embodiment, another one selected from the semiconductor packages may be attached between the one selected from the semiconductor packages and the other semiconductor package.

In yet another example embodiment, a printed circuit board may be attached to a lower part of one selected from the semiconductor packages. The printed circuit board may have a width equal to or smaller than that of one selected from the semiconductor packages. The other semiconductor package may be electrically connected to the printed circuit board via the TSVs.

In accordance with still another aspect of the inventive concepts, a method of forming a package-on-package is provided. A plurality of through silicon vias (TSVs) are formed on an upper surface of a wafer having a plurality of semiconductor chips. Lower ends of the TSVs are buried in the wafer. Upper ends of the TSVs are exposed to the upper surface of the wafer. A lower surface of the wafer is partially removed to expose the lower ends of the TSVs. An encapsulant is formed on at least one surface of the upper and lower surfaces of the wafer using a wafer level molding process. Openings passing through the encapsulant are formed. The openings are aligned with the TSVs. The encapsulant and the wafer are divided to form a plurality of semiconductor packages. Another semiconductor package is stacked on one selected from the semiconductor packages. The other semiconductor package is electrically connected to the TSVs.

In some example embodiments, the encapsulant may be formed to cover the upper surface and the lower surface of the wafer.

In another example embodiment, the semiconductor packages may have substantially the same width as the semiconductor chips. The other semiconductor package may have a width equal to or smaller than that of one of the semiconductor packages. Further, the other semiconductor package may have a width larger than that of one selected from the semiconductor packages.

In still another example embodiment, connection terminals may be formed on the TSVs. The connection terminals may be one selected from the group consisting of a conductive bump, a solder ball, a conductive spacer, a pin grid array (PGA), a lead grid array (LGA), and a combination thereof.

In yet another example embodiment, another one selected from the semiconductor packages may be attached between the one selected from the semiconductor packages and the other semiconductor package.

BRIEF DESCRIPTION OF THE DRAWINGS

The foregoing and other features and advantages of the inventive concepts will be apparent from the more particular description of the example embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EXAMPLE EMBODIMENTS

Figure 1:
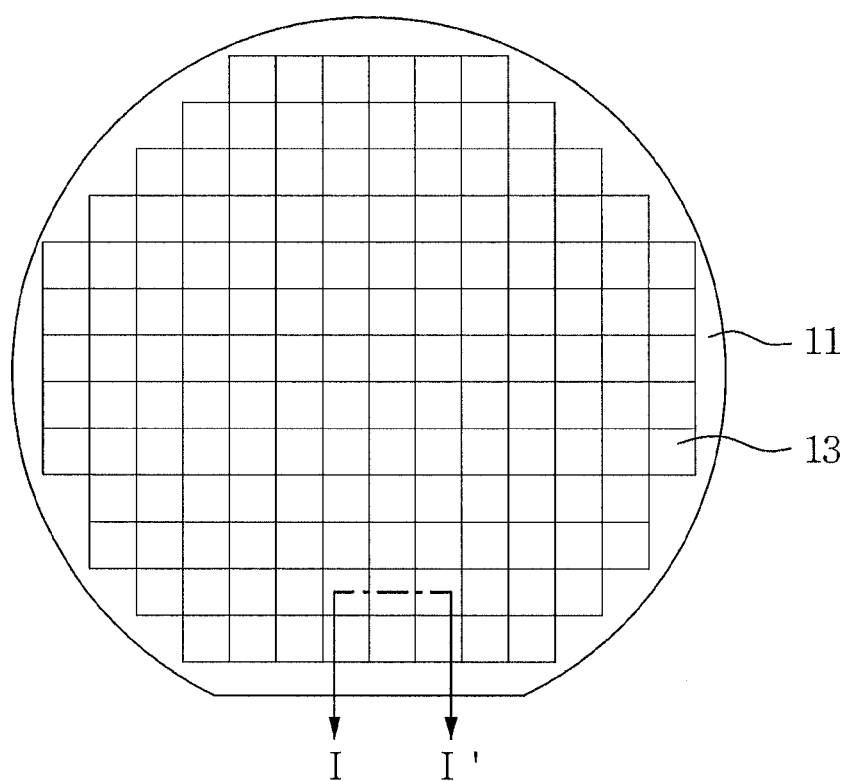
FIG. 1 is a plan view illustrating a method of forming a PoP in accordance with a first example embodiment of the inventive concepts.

Example embodiments will now be described more fully with reference to the accompanying drawings in which the example embodiments are shown. The inventive concepts may, however, be embodied in different forms and should not be construed as limited to the example embodiments set forth herein. Rather, the example embodiments are provided so that this disclosure is thorough and complete and fully conveys the inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers that may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which the inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

First Embodiment

FIG. 1 is a plan view illustrating a method of forming a POP in accordance with a first example embodiment of the inventive concepts, and FIGS. 2 to 13 are cross-sectional views illustrating the method of forming a PoP in accordance with the first example embodiment of the inventive concepts.

Figure 4:
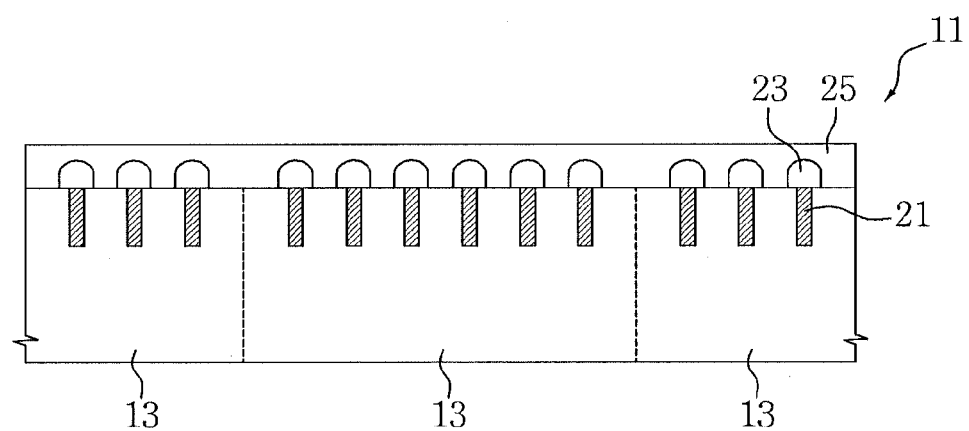
Figure 5:
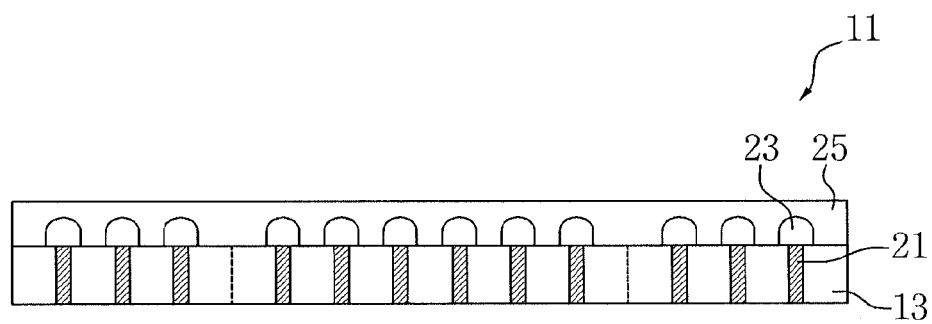
Figure 6:
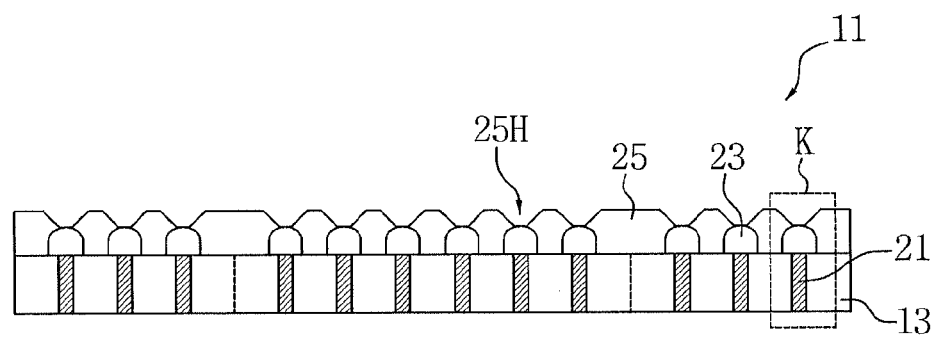
Figure 7:
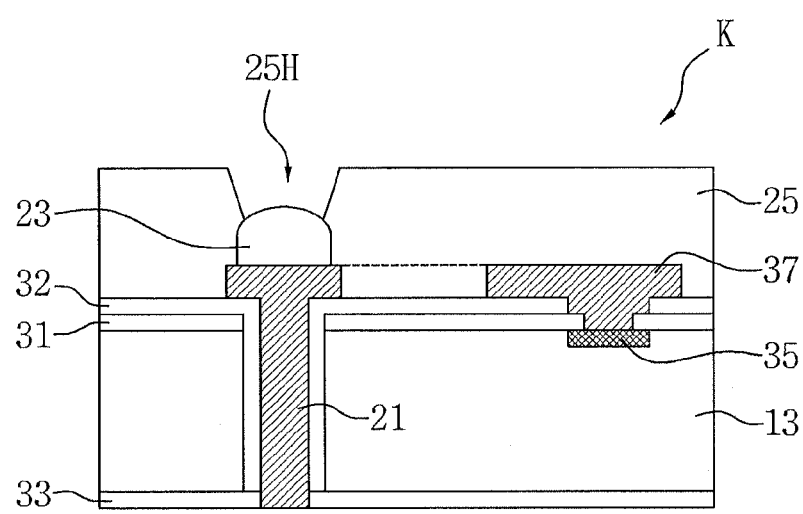

Here, FIGS. 2 to 6 and 8 are cross-sectional views taken along line I-I' of FIG. 1, and FIG. 7A is an enlarged view of a portion K of FIG. 6.

Figure 2:
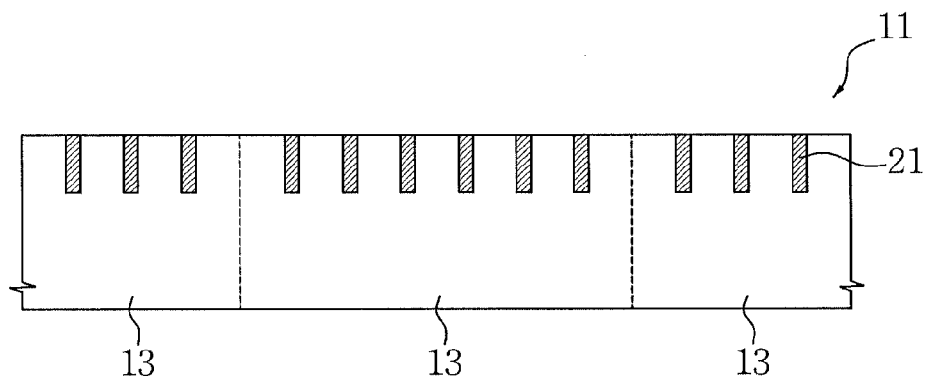
FIGS. 2 to 13 are cross-sectional views illustrating the method of forming a PoP in accordance with the first example embodiment of the inventive concepts.

Referring to FIGS. 1 and 2, the method of forming a PoP in accordance with the first example embodiment of the inventive concepts may include forming a plurality of through silicon vias (TSVs) 21 on a wafer 11. The wafer 11 may include a plurality of semiconductor chips 13. The semiconductor chips 13 may be disposed in a two-dimensional array having rows and columns.

The TSVs 21 may be a conductive layer formed of at least one selected from the group consisting of tungsten (W), tungsten nitride (WN), titanium (Ti), titanium nitride (TiN), tantalum (Ta), tantalum nitride (TaN), aluminum (Al), copper (Cu), and a combination thereof. The TSVs 21 may be formed to penetrate the wafer 11 from one surface to a depth that may or may not be predetermined. That is, upper ends of the TSVs 21 may be exposed to one surface of the wafer 11. Sidewalls and lower ends of the TSVs 21 may be buried in the wafer 11.

The wafer 11 may be formed of a semiconductor substrate such as a silicon wafer or a silicon on insulator (SOI) wafer. While various kinds of active/passive devices (not shown) for constituting the semiconductor chips 13, for example, transistors, data storage elements and/or interconnections, may be formed on the wafer 11, detailed descriptions thereof will be omitted for the convenience of description. In the first example embodiment of the inventive concepts, the TSVs 21 will be described, provided that the TSVs 21 are formed on the same surface as the active/passive devices. However, in some embodiments, the TSVs 21 may be formed on a different surface than the active/passive devices.

The semiconductor chips 13 may include volatile memory chips such as a dynamic random access memory (DRAM) and a static random access memory (SRAM), non-volatile memory chips such as a flash memory, a phase change memory, a magnetic random access memory (MRAM), and a resistive random access memory (RRAM), non-memory chips such as a logic device and a microprocessor, or a combination thereof.

Figure 3:
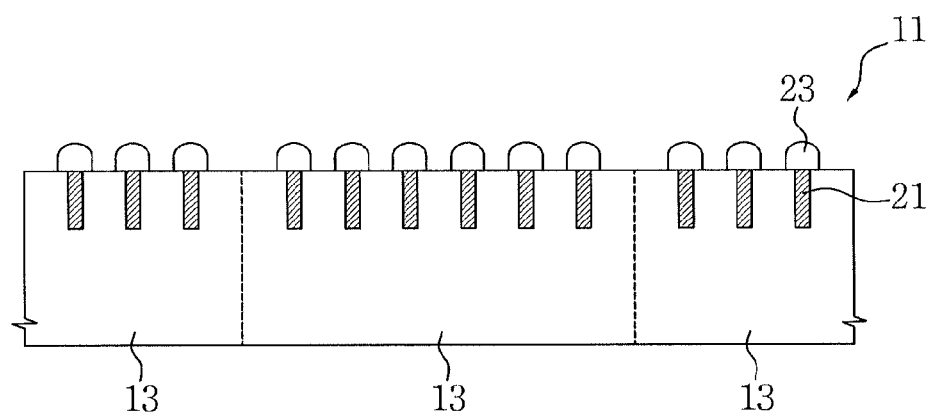

Referring to FIG. 3, internal connection terminals 23 may be formed on the TSVs 21. The internal connection terminals 23 may be a conductive bump, a solder ball, a conductive spacer, a pin grid array (PGA), a lead grid array (LGA), and/or a combination thereof. For example, the internal connection terminals 23 may be formed by attaching the solder ball thereto. The internal connection terminals 23 may contact upper ends of the TSVs 21. In some embodiments, the internal connection terminals 23 may be omitted.

Referring to FIG. 4, an encapsulant 25 may be formed on the wafer 11 using a wafer level molding process. The encapsulant 25 may cover the internal connection terminals 23 and the TSVs 21. The encapsulant 25 may be formed of an epoxy molding compound (EMC) containing resin and filler. In some embodiments, the encapsulant 25 may be formed using liquid resin such as an underfill.

Referring to FIG. 5, the wafer 11 may be partially removed to expose lower ends of the TSVs 21. For example, a lower surface of the wafer 11 may be partially removed using a chemical mechanical polishing (CMP) process, an etch-back process, a back grinding process, and/or a combination thereof, until the lower ends of the TSVs 21 are exposed. As a result, the thickness of the wafer 11 can be remarkably reduced. The encapsulant 25 may protect the semiconductor chips 13 and the internal connection terminals 23 from physical/chemical damages.

Referring to FIG. 6, openings 25H may be formed to expose the internal connection terminals 23 through the encapsulant 25. The openings 25H may be formed using a laser drilling technique or a dry etch technique. The openings 25H may refer to mold vias. The openings 25H may be aligned on the TSVs 21. The openings 2514 may have sizes corresponding to the internal connection terminals 23. Upper surfaces of the internal connection terminals 23 may be exposed by the bottoms of the openings 25H. In some embodiments, when the internal connection terminals 23 are omitted, the upper ends of the TSVs 21 may be exposed by the bottoms of the openings 25H. In another example, a process of forming the openings 2511 may be performed before a process of partially removing the wafer 11 to expose the TSVs 21. In still another embodiment, some of the openings 2511 may be aligned on a re-distribution layer (RDL, not shown) electrically connected to the TSVs 21.

A portion K of FIG. 6 will be described with reference to FIG. 7A in detail. A first insulating layer 31 covering one surface of the semiconductor chip 13 may be provided. The TSV 21 may pass through the first insulating layer 21 and the semiconductor chip 13. A second insulating layer 32 may be provided between the TSV 21 and the semiconductor chip 13. The second insulating layer 32 may cover the first insulating layer 31. The TSV 21 may be electrically insulated from the semiconductor chip 13 by the second insulating layer 32. A third insulating layer 33 may be provided to cover the other surface of the semiconductor chip 13. The first and second insulating layers 31 and 32 may face each other. The TSV 21 may pass through the first and third insulating layers 31 and 33.

The third insulating layer 33 may be formed after a process of partially removing the wafer 11 to expose the TSVs 21 (see FIG. 5). Otherwise, the third insulating layer 33 may be formed before exposing the TSVs 21.

Both ends of the TSV 21 may be substantially flush with surfaces of the semiconductor chip 13, or protrude or be recessed with respect to the surfaces of the semiconductor chip 13. For example, an upper end of the TSV 21 may protrude from an upper surface of the semiconductor chip 13, and a lower end of the TSV 21 may be substantially flush with a lower surface of the semiconductor chip 13. The internal connection terminal 23 may be attached to the upper end of the TSV 21.

The semiconductor chip 13 may include a chip pad 35. The first and second insulating layers 31 and 32 may cover the chip pad 35 and the semiconductor chip 13. An RDL layer 37 contacting the chip pad 35 through the first and second insulating layers 31 and 32 may be formed on the semiconductor chip 13. The RDL layer 37 may be electrically connected to active/passive devices (not shown) in the semiconductor chip 13 via the chip pad 35.

In some embodiments, the RDL 37 may be electrically connected to the TSV 21. In this case, the TSV 21 may be electrically connected to the active/passive devices (not shown) in the semiconductor chip 13 via the RDL 37 and the chip pad 35.

One surface of the semiconductor chip 13 may be covered by the encapsulant 25. That is, the encapsulant 25 may cover the RDL 37, the chip pad 35, the first and second insulating layers 31 and 32, and the TSV 21. The internal connection terminal 23 may be exposed by the opening 25H. That is, the opening 25H may be aligned with the TSV 21.

In some embodiments, another opening 25H" (see FIG. 7B) similar to the opening 25H may also be formed on the RDL 37. That is, at least one of the openings 25H" (see FIG. 7B) may be aligned with the RDL 37.

The first, second and third insulating layers 31, 32 and 33 may be a silicon oxide layer, a silicon nitride layer, a silicon oxynitride layer, and/or a combination thereof. The chip pad 35 may be a conductive layer comprising W, WN, Ti, TiN, Ta, TaN, Al, Cu, and/or a combination thereof. The RDL 37 may be a conductive layer comprising W, WN, Ti, TiN, Ta, TaN, Al, Cu, and a combination thereof.

Figure 8:
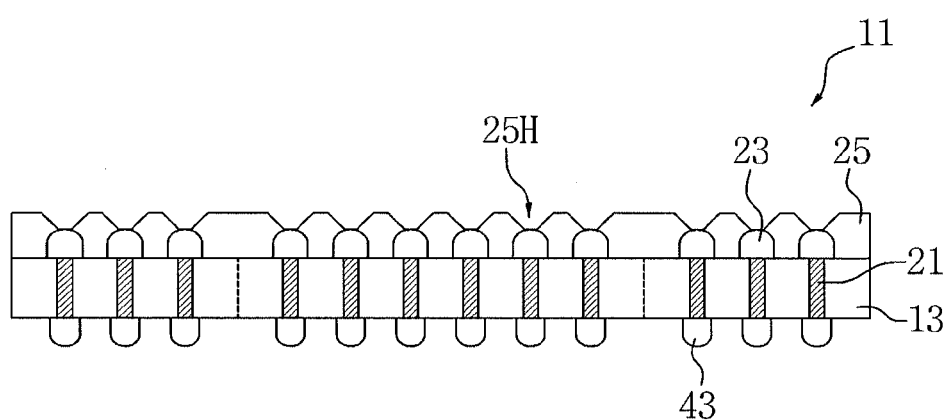

Referring to FIG. 8, external connection terminals 43 may be attached to one surface of the wafer 11. The external connection terminals 43 may contact lower ends of the TSVs 21. The external connection terminals 43 and the internal connection terminals 23 may face each other. The external connection terminals 43 may a conductive bump, a solder ball, a conductive spacer, a PGA, a LGA, and/or a combination thereof. For example, the external connection terminals 43 may be formed using a solder ball attachment technique, a plating technique, and/or a screen printing technique.

In some embodiments, the external connection terminals 43 may be omitted.

Figure 9:
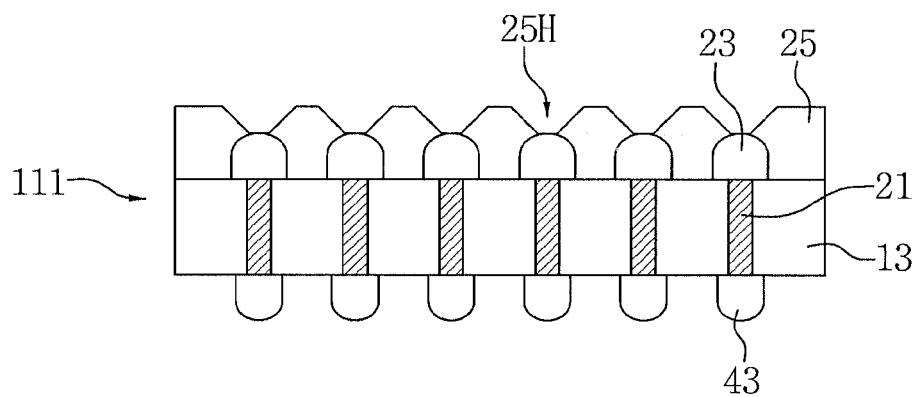

Referring to FIG. 9, the encapsulant 25 and the wafer 11 may be divided into appropriate sizes to form a plurality of semiconductor packages. The plurality of semiconductor packages may be configured similar to a first semiconductor package 111 shown in FIG. 9. The first semiconductor package 111 may include the semiconductor chip 13, the encapsulant 25, the TSVs 21, the external connection terminals 43, and the internal connection terminals 23. Dividing the encapsulant 25 and the wafer 11 into appropriate sizes may be performed using a singulation process.

The first semiconductor package 111 may have substantially the same width as the semiconductor chip 13. The thickness of the first semiconductor package 111 may be determined by the encapsulant 25 and the semiconductor chip 13. Eventually, the size of the first semiconductor package 111 may be reduced remarkably in comparison with the conventional art. In example embodiments, the dividing operations may divide the wafer and encapsulant such that the resulting semiconductor packages include only a single semiconductor chip, however, example embodiments are not limited thereto as the semiconductor packages may include more than one semiconductor chip.

In some embodiments, after dividing the encapsulant 25 and the wafer into appropriate sizes, the external connection terminals 43 may be formed.

Figure 10:
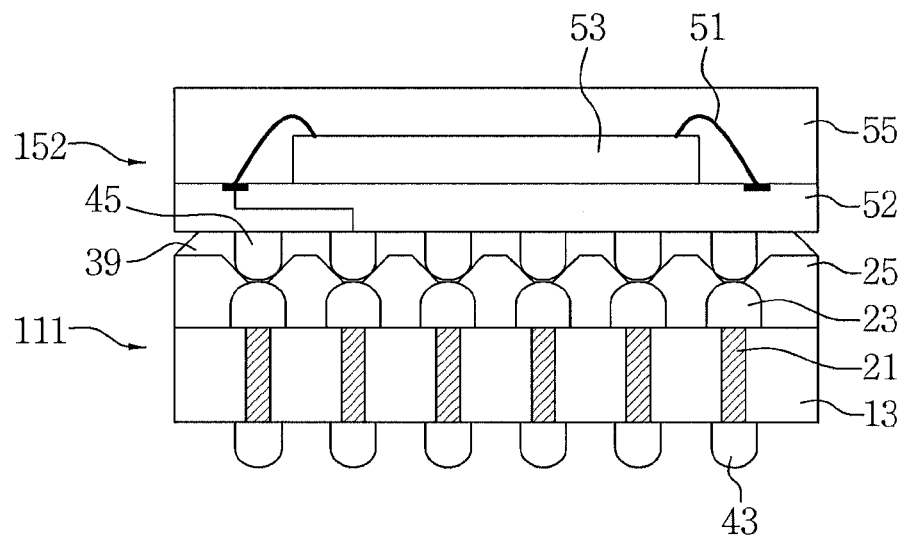

Referring to FIG. 10, the method of forming a PoP in accordance with a first example embodiment of the inventive concepts may include stacking a second semiconductor package 152 on the first semiconductor package 111. The first semiconductor package 111 may be formed using a method similar to that described with reference to FIGS. 1 to 9.

The second semiconductor package 152 may be formed by attaching a second semiconductor chip 53 onto a printed circuit board 52. The second semiconductor chip 53 may be electrically connected to the printed circuit board 52 using a bonding wire 51. The printed circuit board 52 and the second semiconductor chip 53 may be covered by a second encapsulant 55. Second external connection terminals 45 may be formed on one surface of the printed circuit board 52. The second semiconductor chip 53 may be electrically connected to the second external connection terminals 45 via the bonding wire 51 and the printed circuit board 52.

The printed circuit board 52 may be a flexible printed circuit board, a rigid printed circuit board, or a combination thereof. The bonding wire 51 may be formed using a wire bonding technique, a beam lead bonding technique, a tape bonding technique, and/or a combination thereof. The bonding wire 51 may be gold wire, an aluminum wire, a beam lead, a conductive tape, and/or a combination thereof.

The second semiconductor chip 53 may include volatile memory chips such as a DRAM and a SRAM, non-volatile memory chips such as a flash memory, a phase change memory, a MRAM, and a RRAM, non-memory chips such as a logic device and a microprocessor, or a combination thereof. The second external connection terminals 45 may be a conductive bump, a solder ball, a conductive spacer, a PGA, a LGA, and/or a combination thereof.

An underfill 39 may be formed between the first semiconductor package 111 and the second semiconductor package 152. The second external connection terminals 45 may contact the internal connection terminals 23 through the underfill 39. In this example embodiment, the external connection terminals 43 may be electrically connected to the second semiconductor chip 53 via the TSV 21, the internal connection terminals 23, the second external connection terminals 45, the printed circuit board 52, and the bonding wire 51.

The first semiconductor package 111 may have substantially the same width as the semiconductor chip 13. The thickness of the first semiconductor package 111 may be determined by the encapsulant 25 and the semiconductor chip 13. The printed circuit board 52 may have a width substantially equal to or smaller than that of the first semiconductor package 111. That is, the second semiconductor package 152 may have a width substantially equal to or smaller than that of the first semiconductor package 111. In accordance with the first example embodiment of the inventive concepts, since additional electric means disposed at an outer periphery of the semiconductor chip 13 to electrically connect the first semiconductor package 111 and the second semiconductor package 152 can be omitted, it is possible to remarkably reduce the size of the PoP in comparison with the conventional art.

In another embodiment, the printed circuit board 52 may have a width larger than that of the first semiconductor package 111. That is, the second semiconductor package 152 may have a width larger than that of the first semiconductor package 111.

Figure 11:
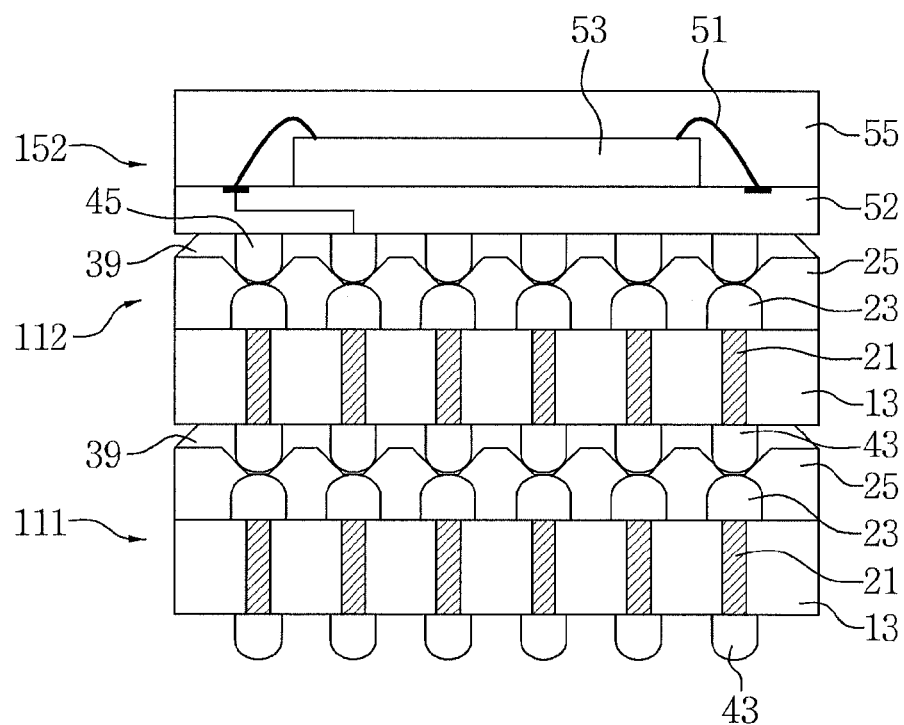

Referring to FIG. 11, methods of forming a PoP in accordance with some example embodiments of the inventive concepts may include stacking the second semiconductor package 152 and a third semiconductor package 112 on the first semiconductor package 111. The first semiconductor package 111 and the third semiconductor package 112 may be formed through a method similar to that of FIGS. 1 to 9. The second semiconductor package 152 may be similar to that described with reference to FIG. 10. The third semiconductor package 112 may be stacked between the first semiconductor package 111 and the second semiconductor package 152.

Figure 12:
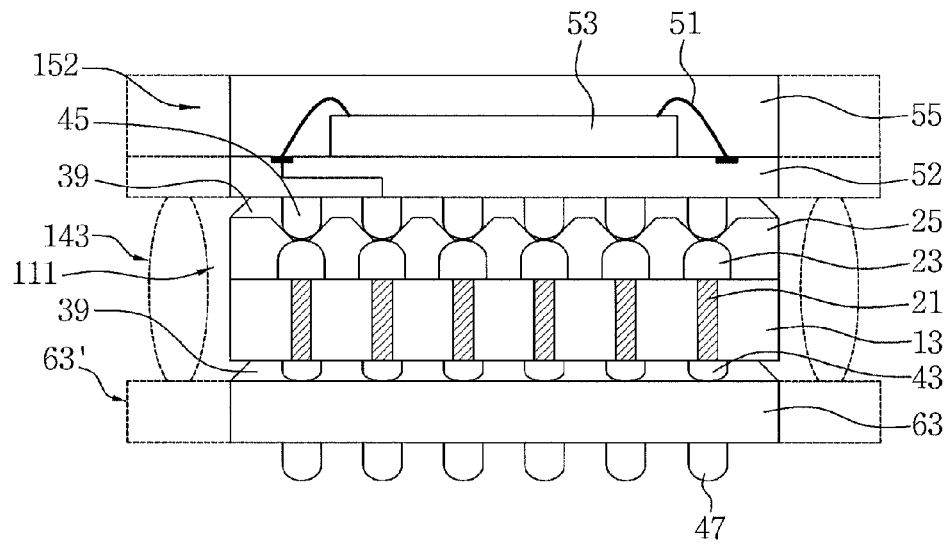

Referring to FIG. 12, methods of forming a PoP in accordance with some example embodiments of the inventive concepts may include sequentially stacking the first semiconductor package 111 and the second semiconductor package 152 on a second printed circuit board 63. The first semiconductor package 111 may be formed through a method similar to that described with reference to FIG. 9. The second semiconductor package 152 may be similar to that described with reference to FIG. 10.

The second printed circuit board 63 may be a flexible printed circuit board, a rigid printed circuit board, or a combination thereof. An underfill 39 may be formed between the second printed circuit board 63 and the first semiconductor package 111. The external connection terminals 43 may contact the second printed circuit board 63 through the underfill 39.

Board connection terminals 47 may be formed on one surface of the second printed circuit board 63. The board connection terminals 47 may be a conductive bump, a solder ball, a conductive spacer, a PGA, a LGA, and a combination thereof.

The semiconductor chip 13 and the second semiconductor chip 53 may be electrically connected to the board connection terminals 47 via the TSVs 21 and the second printed circuit board 63. Therefore, the second printed circuit board 63 does not require a marginal space 63' to dispose bypass connection terminals 143.

The width of the first semiconductor package 111 may be determined by the semiconductor chip 13. For example, the width of the first semiconductor package 111 may be substantially equal to that of the semiconductor chip 13. The width of the second printed circuit board 63 may be determined by the first semiconductor package 111. For example, the width of the second printed circuit board 63 may be substantially equal to or smaller than that of the first semiconductor package 111. In addition, the width of the second semiconductor package 152 may also be substantially equal to or smaller than that of the first semiconductor package 111. Eventually, in accordance with some example embodiments of the inventive concepts, it is possible to remarkably reduce the size of the PoP in comparison with the conventional art.

In another example embodiment, the width of the second semiconductor package 152 may be larger than that of the first semiconductor package 111.

Figure 13:
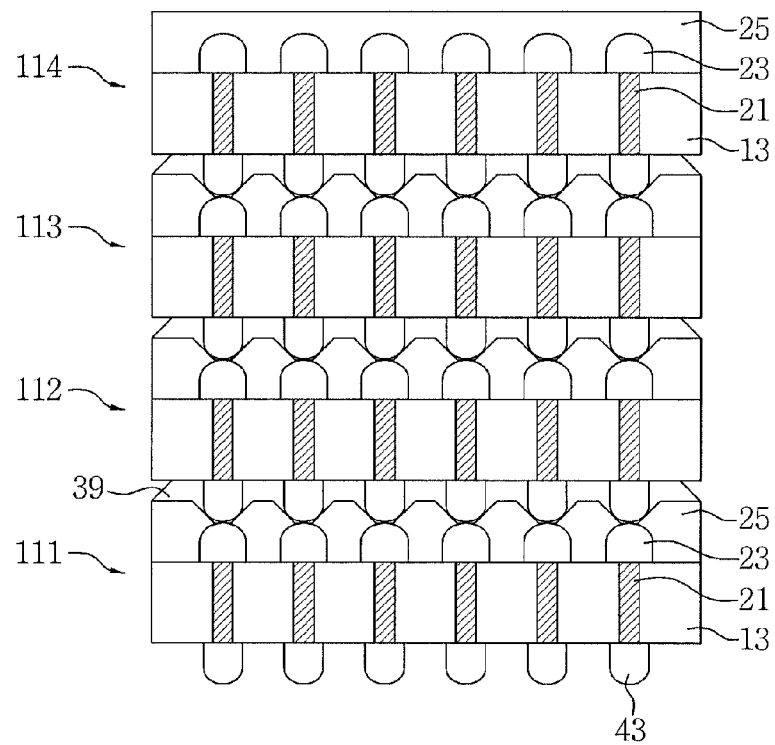

Referring to FIG. 13, methods of forming a PoP in accordance with some example embodiments of the inventive concepts may include sequentially stacking the third semiconductor package 112, a fourth semiconductor package 113 and a fifth semiconductor package 114 on the first semiconductor package 111. The first, third, fourth and fifth semiconductor packages 111, 112, 113 and 114 may be formed through a method similar to that described with reference to FIGS. 1 to 9. The fifth semiconductor package 114 may be formed by omitting the process of forming the openings 2511 (see FIG. 6).

In another embodiment, the fifth semiconductor package 114 may be formed by omitting the process of forming the internal connection terminals 23 (see FIG. 3). In still another embodiment, the fifth semiconductor package 114 may not include the TSV 21.

In the above example embodiment the wafer is cut in a manner such that the resulting semiconductor packages including only a single semiconductor chip. However, example embodiments of the inventive concepts are not limited thereto as the resulting semiconductor packages may include more than one semiconductor chip. Likewise, although the second semiconductor package is illustrated as having one semiconductor chip, the second semiconductor package may include several semiconductor chips. For example, the wafer may be cut such that two (or more) adjacent semiconductor chips arranged on the wafer are formed in one first package and the two semiconductor chips of the first package may be connected to two chips of a second semiconductor package. in the manner described above.

Second Embodiment

FIGS. 14 to 20 are cross-sectional views illustrating a method of forming a PoP in accordance with a second example embodiment of the inventive concepts.

Figure 14:
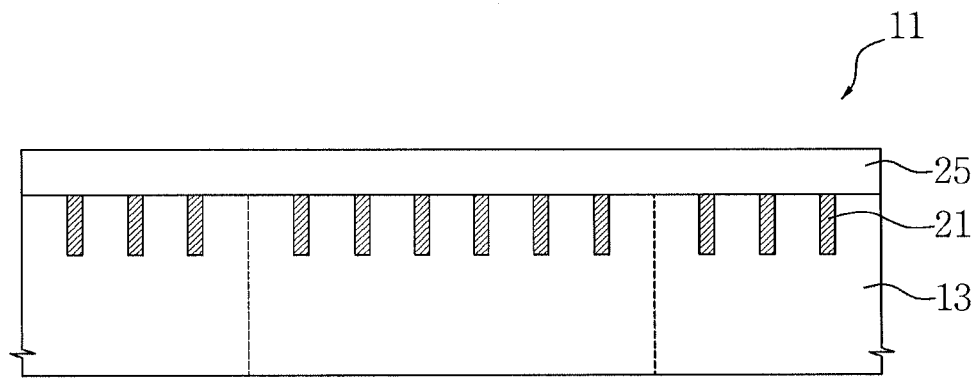
FIGS. 14 to 20 are cross-sectional views illustrating a method of forming a PoP in accordance with a second example embodiment of the inventive concepts.

Referring to FIG. 14, the method of forming a PoP in accordance with a second example embodiment of the inventive concepts may include forming a plurality of TSVs 21 in a wafer 11. The wafer 11 may include a plurality of semiconductor chips 13. The TSVs 21 may be formed to penetrate the wafer 11 from one surface to a depth that may or may not be predetermined.

An encapsulant 25 may be formed on the wafer 11 using a wafer level molding process. The encapsulant 25 may cover the TSVs 21. The encapsulant 25 may be formed of EMC containing resin and filler. In some embodiments, the encapsulant 25 may be formed using liquid resin such as an underfill.

Figure 15:
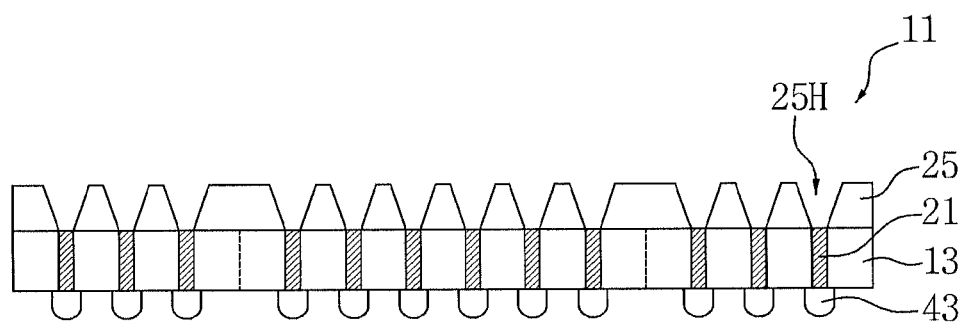

Referring to FIG. 15, the wafer 11 may be partially removed to expose the TSVs 21. For example, a lower surface of the wafer 11 may be partially removed using a CMP process, an etch-back process, a back grinding process, and/or a combination thereof, until one ends of the TSVs 21 are exposed. As a result, the thickness of the wafer 11 can be remarkably reduced.

Openings 25H exposing the TSVs 21 through the encapsulant 25 may be formed. The openings 25H may be formed using a laser drilling technique or a dry etch technique. The openings 25H may be referred to as mold vias. Upper surfaces of the TSVs 21 may be exposed by the bottoms of the openings 25H. In some embodiments, the process of forming the openings 25H may be performed prior to the process of partially removing the wafer 11 to expose the TSVs 21.

External connection terminals 43 may be attached to one surface of the wafer 11. One ends of the TSVs 21 may contact the external connection terminals 43, and the other ends of the TSVs 21 may be exposed to the openings 25H. In some embodiments, the external connection terminals 43 may be omitted. In another embodiment, the external connection terminals 43 may be formed prior to the process of forming the openings 25H.

Figure 16:
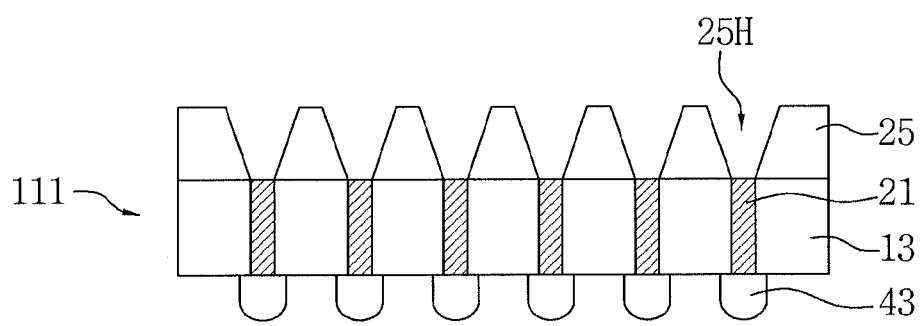

Referring to FIG. 16, the encapsulant 25 and the wafer 11 may be divided into appropriate sizes to form a plurality of semiconductor packages. The plurality of semiconductor packages may be configured similar to the first semiconductor package 111 shown in FIG. 16. The first semiconductor package 111 may include the semiconductor chip 13, the encapsulant 25, the TSVs 21, and the external connection terminals 43. Dividing the encapsulant 25 and the wafer 11 into appropriate sizes may be performed using a singulation process.

In some embodiments, after dividing the encapsulant 25 and the wafer 11 into appropriate sizes, the external connection terminals 43 may be formed.

Figure 17:
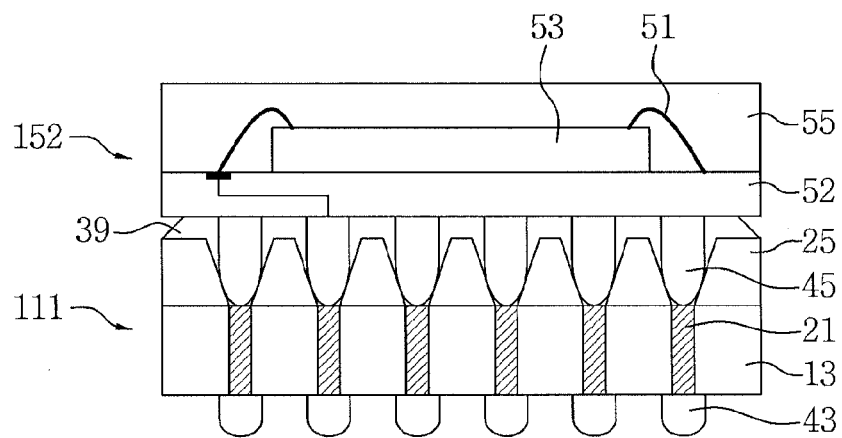

Referring to FIG. 17, the method of forming a PoP in accordance with the second example embodiment of the inventive concepts may include stacking a second semiconductor package 152 on the first semiconductor package 111. The first semiconductor package 111 may be formed through a method similar to that described with reference to FIGS. 14 to 16.

The second semiconductor package 152 may be formed by attaching a second semiconductor chip 53 onto a printed circuit board 52. The second semiconductor chip 53 may be electrically connected to the printed circuit board 52 using a bonding wire 51, or connected to the printed circuit board through a flip chip bonding method. The printed circuit board 52 and the second semiconductor chip 53 may be covered by a second encapsulant 55. Second external connection terminals 45 may be formed on one surface of the printed circuit board 52. The second semiconductor chip 53 may be electrically connected to the second external connection terminals 45 via the printed circuit board 52.

An underfill 39 may be formed between the first and second semiconductor package 111 and 152. The second external connection terminals 45 may contact the TSVs 21 through the underfill 39. The external connection terminals 43 may be electrically connected to the second semiconductor chip 53 via the TSVs 21, the second external connection terminals 45, the printed circuit board 52, and the bonding wire 51.

Figure 18:
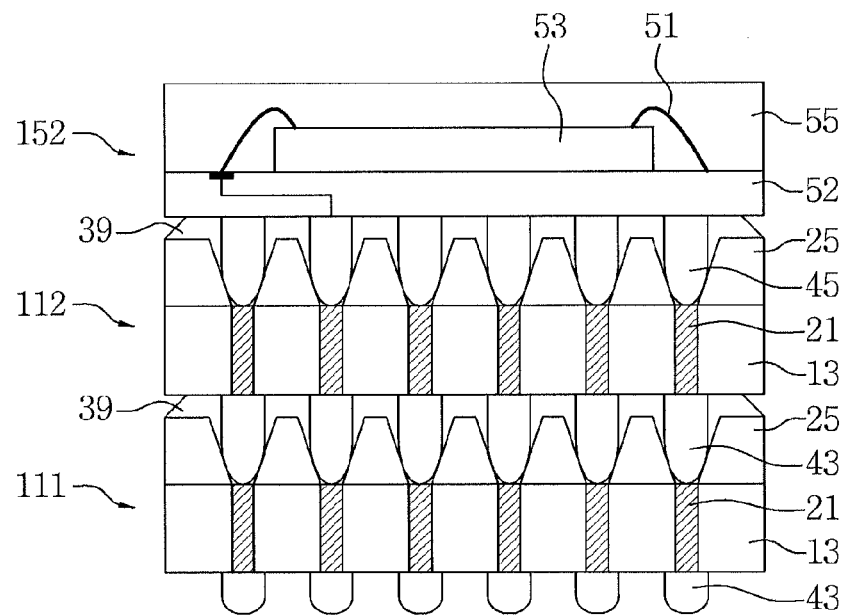

Referring to FIG. 18, methods of forming a PoP in accordance with some example embodiments of the inventive concepts may include stacking the second and third semiconductor packages 152 and 112 on the first semiconductor package 111. The first and third semiconductor packages 111 and 112 may be formed through a method similar to that described with reference to FIGS. 14 to 16. The second semiconductor package 152 may be similar to that described with reference to FIG. 17. The third semiconductor package 112 may be stacked between the first and second semiconductor packages 111 and 152.

Figure 19:
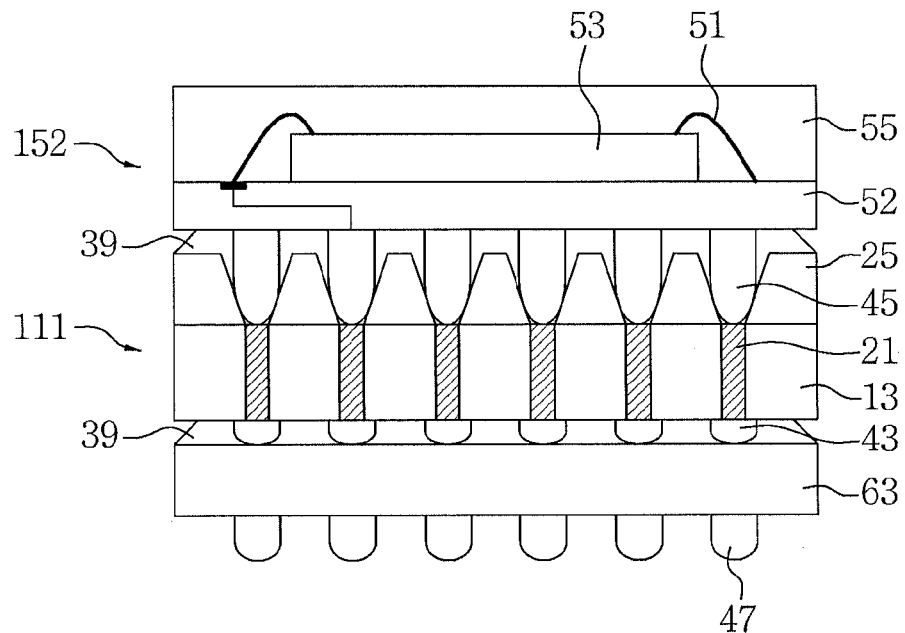

Referring to FIG. 19, methods of forming a PoP in accordance with some example embodiments of the inventive concepts may include sequentially stacking the first and second semiconductor packages 111 and 152 on the second printed circuit board 63. The first semiconductor package 111 may be formed through a method similar to that described with reference to FIGS. 14 to 16. The second semiconductor package 152 may be similar to that described with reference to FIG. 17. An underfill may be formed between the second printed circuit board 63 and the first semiconductor package 111. The external connection terminals 43 may contact the second printed circuit board 63 through the underfill 39. Board connection terminals 47 may be formed on one surface of the second printed circuit board 63. The semiconductor chip 13 and the second semiconductor chip 53 may be electrically connected to the board connection terminals 47 via the TSVs 21 and the second printed circuit board 63.

The width of the first semiconductor package 111 may be determined by the semiconductor chip 13. For example, the first semiconductor package 111 may have substantially the same width as the semiconductor chip 13. The width of the second printed circuit board 63 may be determined by the first semiconductor package 111. For example, the second printed circuit board 63 may have a width substantially equal to or smaller than that of the first semiconductor package 111. In addition, the second semiconductor package 152 may also have a width substantially equal to or smaller than that of the first semiconductor package 111. In accordance with some example embodiments of the inventive concepts, it is possible to remarkably reduce the size of the PoP.

In another embodiment, the second printed circuit board 63 may have a larger width than the first semiconductor package 111.

Figure 20:
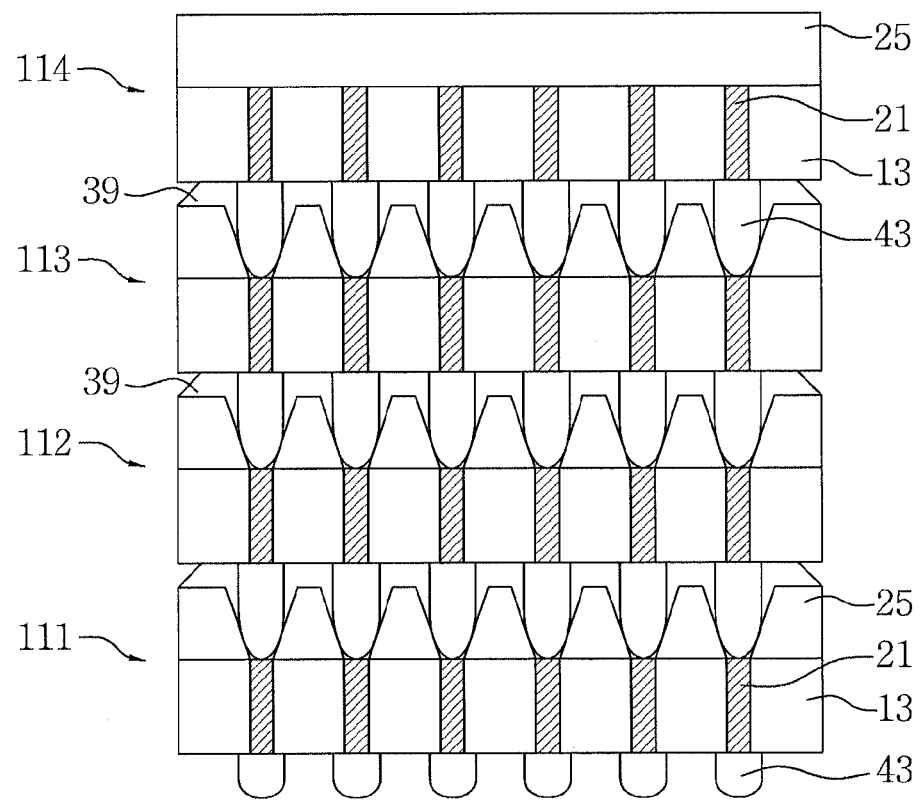

Referring to FIG. 20, methods of forming a PoP in accordance with some example embodiments of the inventive concepts may include sequentially stacking the third, fourth and fifth semiconductor packages 112, 113 and 114 on the first semiconductor package 111. The first, third, fourth and fifth semiconductor packages 111, 112, 113 and 114 may be formed through a method similar to that described with reference to FIGS. 14 to 16. The fifth semiconductor package 114 may be formed by omitting the process of forming the openings 25H (see FIG. 15).

Third Embodiment

Figure 21:
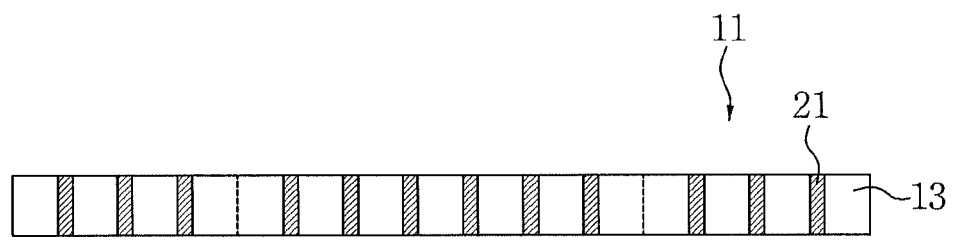
FIGS. 21 and 22 are cross-sectional views illustrating a method of forming a PoP in accordance with a third example embodiment of the inventive concepts.
Figure 22:
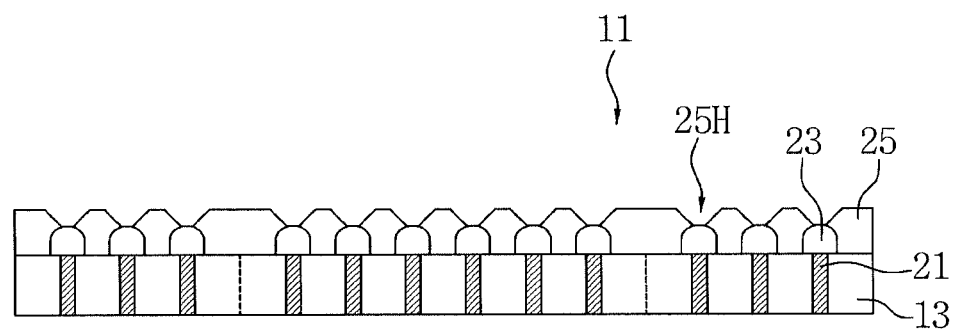

FIGS. 21 and 22 are cross-sectional views illustrating a method of forming a PoP in accordance with a third example embodiment of the inventive concepts.

Referring to FIG. 21, the method of forming a PoP in accordance with the third example embodiment of the inventive concepts may include forming a plurality of TSVs 21 on a wafer 11. The wafer 11 may include a plurality of semiconductor chips 13. The wafer 11 may be partially removed to expose the TSVs 21. For example, a lower surface of the wafer 11 may be partially removed using a CMP process, an etch-back process, a back grinding process, and/or a combination thereof, until one ends of the TSVs 21 are exposed. As a result, the thickness of the wafer 11 can be remarkably reduced. One ends of the TSVs 21 may be exposed by one surface of the wafer 11, and the other ends of the TSVs 21 may be exposed by the other surface of the wafer 11.

Referring to FIG. 22, internal connection terminals 23 may be formed on the TSVs 21. The internal connection terminals 23 may be a conductive bump, a solder ball, a conductive spacer, a PGA, a LGA, and a combination thereof. The internal connection terminals 23 may contact the TSVs 21.

The internal connection terminals 23 may be formed on an upper surface of the wafer 11. That is, the internal connection terminals 23 may be formed on the same surface of the wafer 11 on which the active/passive devices (not shown) are formed. Otherwise, the internal connection terminals 23 may be formed on a lower surface of the wafer 11. In some embodiments, the internal connection terminals 23 may be omitted.

An encapsulant 25 may be formed on the wafer 11 using a wafer level molding process. The encapsulant 25 may cover the internal connection terminals 23 and the TSVs 21. The encapsulant 25 may be formed of EMC containing resin and filler. In some embodiments, the encapsulant 25 may be formed using liquid resin such as an underfill. Here, one surface of the wafer 11 may be exposed.

Openings 25H exposing the internal connection terminals 23 through the encapsulant 25 may be formed. The openings 25H may be formed using a laser drilling technique or a dry etch technique. The openings 25H may be referred to as mold vias. Upper surfaces of the internal connection terminals 23 may be exposed by bottoms of the openings 25H. In some embodiments, when the internal connection terminals 23 are omitted, the TSVs 21 may be exposed to the bottoms of the openings 25H.

Then, the PoP may be formed through a method similar to that described with reference to FIGS. 7 to 13.

Fourth Embodiment

Figure 23:
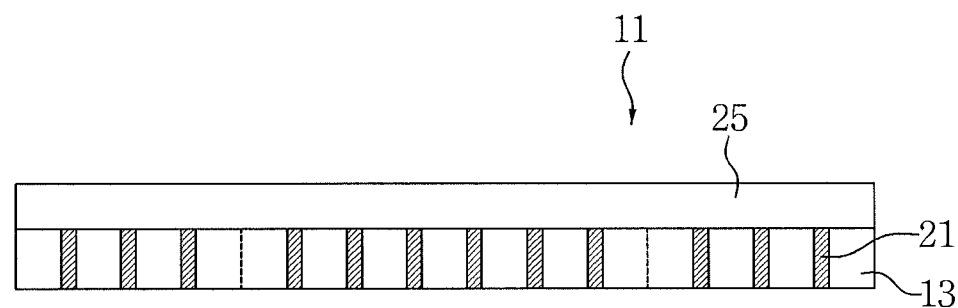
FIG. 23 is a cross-sectional view illustrating a method of forming a PoP in accordance with a fourth example embodiment of the inventive concepts.

FIG. 23 is a cross-sectional view illustrating a method of forming a PoP in accordance with a fourth example embodiment of the inventive concepts.

Referring to FIG. 23, the method of forming a Pop in accordance with the fourth example embodiment of the inventive concepts may include forming a plurality of TSVs 21 on a wafer 11. The wafer 11 may include a plurality of semiconductor chips 13. The wafer 11 may be partially removed to expose the TSVs 21. For example, a lower surface of the wafer 11 may be partially removed using a CMP process, an etch-back process, a back grinding process, and/or a combination thereof, until one ends of the TSVs 21 are exposed. As a result, the thickness of the wafer 11 can be remarkably reduced. One ends of the TSVs 21 may be exposed by one surface of the wafer 11, and the other ends of the TSVs 21 may be exposed by the other surface of the wafer 11.

An encapsulant 25 may be formed on the wafer 11 using a wafer level molding process. The encapsulant 25 may cover the TSVs 21. The encapsulant 25 may be formed of EMC containing resin and filler. In some embodiments, the encapsulant 25 may be formed using liquid resin such as an underfill.

The encapsulant 25 may be formed on an upper surface of the wafer 11. That is, the encapsulant 25 may be formed on the same surface of the wafer 11 on which active/passive devices (not shown) are formed. Otherwise, the encapsulant 25 may be formed on a lower surface of the wafer 11. Here, one surface of the wafer 11 may be exposed.

Then, the PoP may be formed through a method described with reference to FIGS. 15 to 20.

Fifth Embodiment

Figure 24:
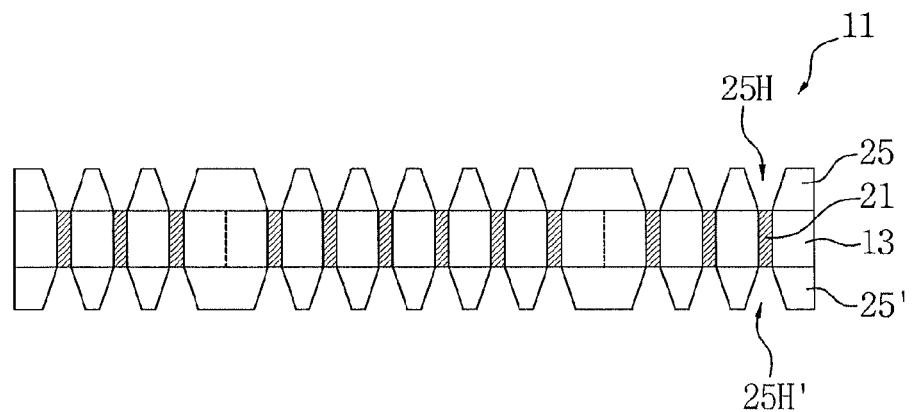
FIGS. 24 to 26 are cross-sectional views illustrating a method of forming a PoP in accordance with a fifth example embodiment of the inventive concepts.
Figure 25:
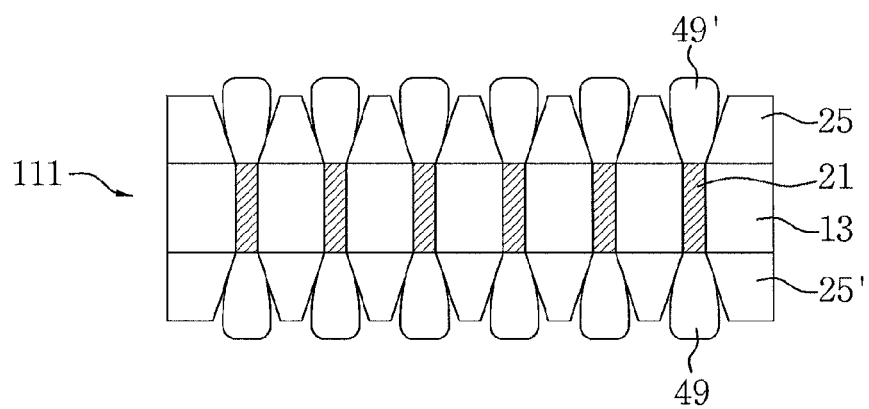
Figure 26:
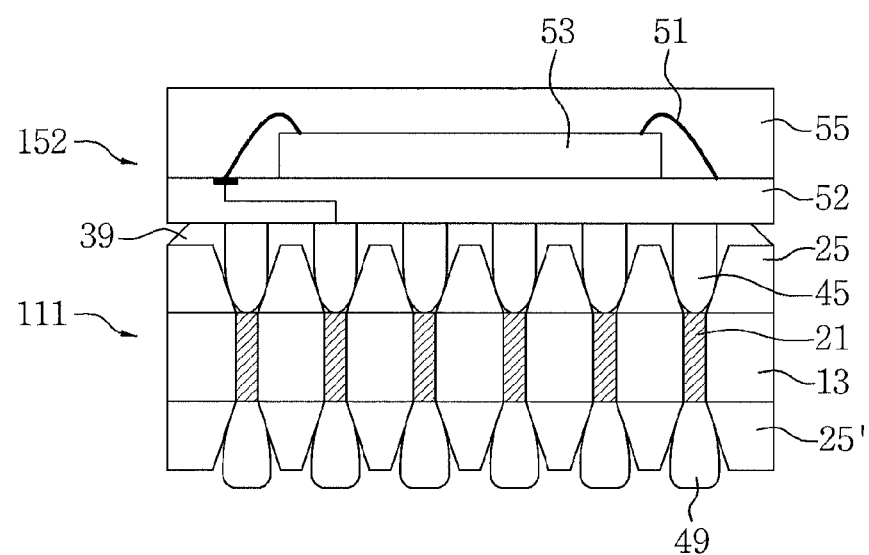

FIGS. 24 to 26 are cross-sectional views illustrating a method of forming a PoP in accordance with a fifth example embodiment of the inventive concepts.

Referring to FIG. 24, the method of forming a PoP in accordance with the fifth example embodiment of the inventive concepts may include forming a plurality of TSVs 21 in a wafer 11. The wafer 11 may include a plurality of semiconductor chips 13. The wafer 11 may be partially removed to expose the TSVs 21. For example, a lower surface of the wafer 11 may be partially removed using a CMP process, an etch-back process, a back grinding process, and/or a combination thereof, until one ends of the TSVs 21 are exposed. As a result, the thickness of the wafer 11 can be remarkably reduced. One ends of the TSVs 21 may be exposed by one surface of the wafer 11, and the other ends of the TSVs 21 may be exposed by the other surface of the wafer 11.

Encapsulants 25 and 25' may be formed to cover opposite surfaces of the wafer 11 using a wafer level molding process. The encapsulants 25 and 25' may cover the TSVs 21. The encapsulants 25 and 25' may be formed of EMC containing resin and filler. In some embodiments, the encapsulants 25 and 25' may be formed using liquid resin such as an underfill. The encapsulants 25 and 25' may include a first encapsulant 25 and a second encapsulant 25'.

Openings 25H and 25H' exposing the TSVs 21 through the encapsulants 25 and 25' may be formed. The openings 25H and 25H' may be formed using a laser drilling technique. The openings 25H and 25H' may be referred to as mold vias. Surfaces of the TSVs 21 may be exposed to bottoms of the openings 25H and tops of the openings 25H'.

Referring to FIG. 25, lower and upper connection terminals 49 and 49' may be formed at lower and upper parts of the wafer 11. One ends of the TSVs 21 may contact the lower connection terminals 49, and the other ends of the TSVs 21 may contact the upper connection terminals 49'. In some embodiments, the lower and upper connection terminals 49 and 49' may be selectively omitted. For example, all of the upper connection terminals 49' may be omitted. The lower and upper connection terminals 49 and 49' may protrude from surfaces of the encapsulants 25 and 25'.

The lower connection terminals 49 may be a conductive bump, a solder ball, a conductive spacer, a PGA, a LGA, and a combination thereof. The upper connection terminals 49' may be one selected from the group consisting of a conductive bump, a solder ball, a conductive spacer, a PGA, a LGA, and a combination thereof.

The encapsulants 25 and 25' and the wafer 11 may be divided into appropriate sizes to form a plurality of semiconductor packages. The plurality of semiconductor packages may have a constitution similar to the first semiconductor package 111 shown in FIG. 26. The first semiconductor package 111 may include the semiconductor chip 13, the encapsulants 25 and 25', the TSVs 21, and the lower and upper connection terminals 49 and 49'. Dividing the encapsulants 25 and 25' and the wafer 11 into appropriate sizes may be performed using a singulation process.

In some embodiments, after dividing the encapsulants 25 and 25' and the wafer 11 into appropriate sizes, the lower and upper connection terminals 49 and 49' may be formed.

Referring to FIG. 26, the method of forming a PoP in accordance with the fifth example embodiment of the inventive concepts may include stacking a second semiconductor package 152 on the first semiconductor package 111. The first semiconductor package 111 may be formed through a method similar to that described with reference to FIGS. 24 and 25.

The second semiconductor package 152 may be formed by attaching a second semiconductor chip 53 onto a printed circuit board 52. The second semiconductor chip 53 may be electrically connected to the printed circuit board 52 using a bonding wire 51 or a flip chip bonding method. The printed circuit board 52 and the second semiconductor chip 53 may be covered by a second encapsulant 55. Second external connection terminals 45 may be formed at one surface of the printed circuit board 52. The second semiconductor chip 53 may be electrically connected to the second external connection terminals 45 via the bonding wire 51 and the printed circuit board 52.

An underfill 39 may be formed between the first and second semiconductor packages 111 and 152. The second external connection terminals 45 may contact the TSVs 21 through the underfill 39. The lower connection terminals 49 may be electrically connected to the second semiconductor chip 53 via the TSVs 21, the second external connection terminals 45, the printed circuit board 52, and the bonding wire 51.

Sixth Embodiment

Figure 27:
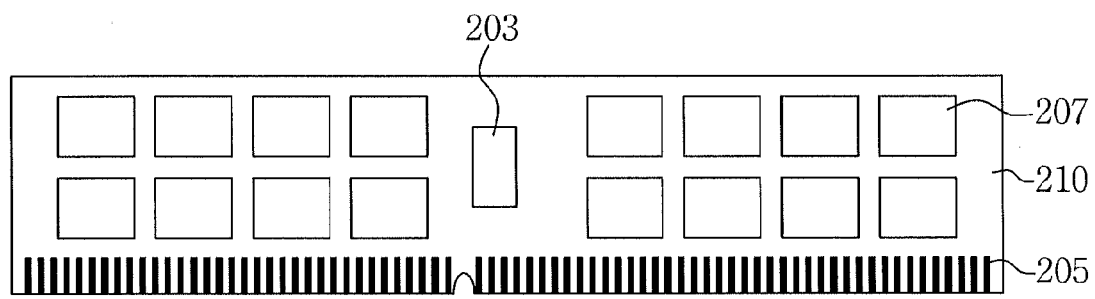
FIG. 27 is a plan view of a semiconductor module employing a PoP in accordance with a sixth example embodiment of the inventive concepts.

FIG. 27 is a plan view of a semiconductor module employing a PoP in accordance with a sixth embodiment of the inventive concepts.

Referring to FIG. 27, the semiconductor module employing a PoP in accordance with the sixth example embodiment of the inventive concepts may include a module substrate 210, a plurality of PoPs 207, and a control chip package 203. Input/output terminals 205 may be formed at the module substrate 210. The PoPs 207 may be configured similar to that described with reference to FIGS. 1 to 26.

The PoPs 207 and the control chip package 203 may be mounted on the module substrate 210. The PoPs 207 and the control chip package 203 may be electrically connected to the input/output terminals 205 in series or parallel.

The control chip package 203 may be omitted. The PoP 207 may include volatile memory chips such as a DRAM and a SRAM, non-volatile memory chips such as a flash memory, a phase change memory, a MRAM, and a RRAM, non-memory chips such as a logic device and a microprocessor, or a combination thereof. In this case, the semiconductor module in accordance with a sixth example embodiment of the inventive concepts may be a memory module.

Seventh Embodiment

Figure 28:
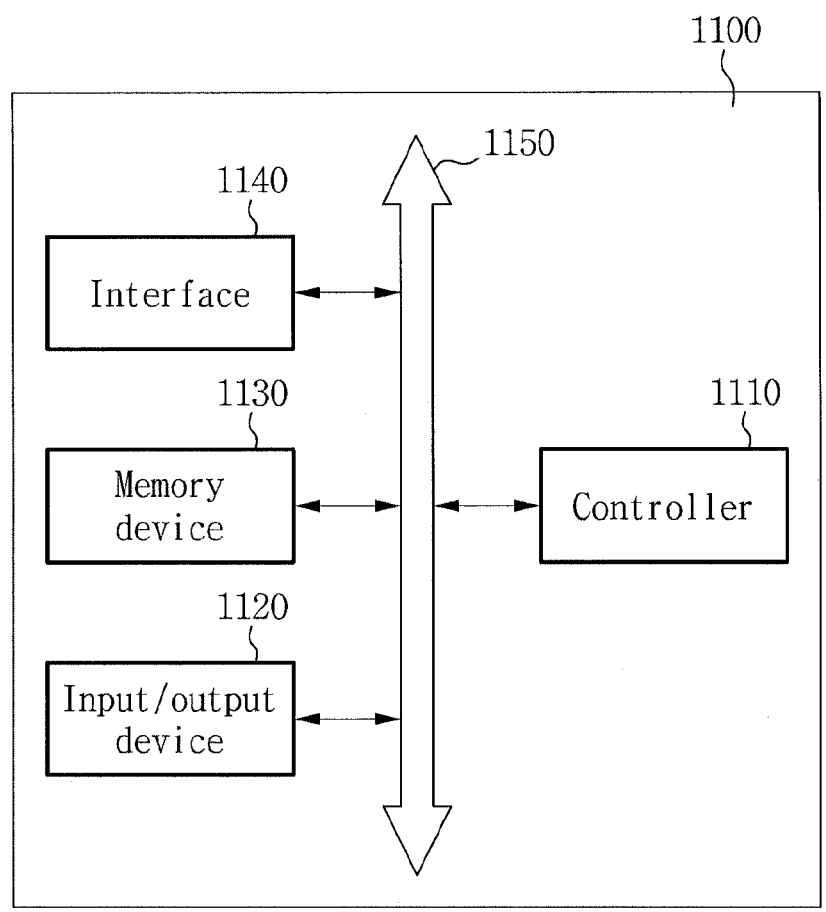
FIG. 28 is a block diagram of an electronic system employing a PoP in accordance with a seventh example embodiment of the inventive concepts.

FIG. 28 is a block diagram of an electronic system employing a PoP in accordance with a seventh example embodiment of the inventive concepts.

Referring to FIG. 28, an electronic system 1100 in accordance with the seventh example embodiment of the inventive concepts may include a controller 1110, an input/output device 1120, a memory device 1130, an interface 1140, and a bus structure 1150. The memory device 1130 may be constituted by a PoP similar to that described with reference to FIGS. 1 to 26. In addition, the controller 1110 may also be constituted by a PoP similar to that described with reference to FIGS. 1 to 26. Further, a combination of the controller 1110 and the memory device 1130 may be constituted by a PoP similar to that described with reference to FIGS. 1 to 26. The bus structure 1150 may function to provide a path through which data moves between the controller 1110, the input/output device 1120, the memory device 1130, and the interface 1140.

The controller 1110 may include at least one microprocessor, a digital signal processor, a microcontroller, and/or at least one of logic devices capable of performing functions similar to the above. The input/output device 1120 may include at least one selected from a keypad, a keyboard, a display device, etc. The memory device 1130 may function to store data and/or a command, etc., performed by the controller 1110.

The memory device 1130 may include volatile memory chips such as a DRAM and a SRAM, non-volatile memory chips such as a flash memory, a phase change memory, a MRAM, and a RRAM, non-memory chips such as a logic device and a microprocessor, and/or a combination thereof. For example, the electronic system 1100 may be a solid state disk (SSD).

The interface 1140 may function to transmit data to a communication network or receive data from the communication network. The interface 1140 may be a wired or wireless system. For example, the interface 1140 may include an antenna, a wired/wireless transceiver, etc. The electronic system 1100 may further include an application chipset, a camera image processor (CIS), an input/output device, etc.

The electronic system 1100 may be implemented by a mobile system, a personal computer, an industrial computer, logic systems performing various functions, etc. For example, the mobile system may be any one of a personal digital assistant (PDA), a mobile computer, a web tablet, a mobile phone, a wireless phone, a laptop computer, a memory card, a digital music system, and an information transmission/reception system. When the electronic system 1100 is wireless communication equipment, the electronic system 1100 may be used in communication systems such as code division multiple access (CDMA), global system for mobile communication (GSM), north American digital cellular (NADC), enhanced-time division multiple access (E-TDMA), wideband code division multiple access (WCDMA), and CDMA2000.

Eighth Embodiment

Figure 29:
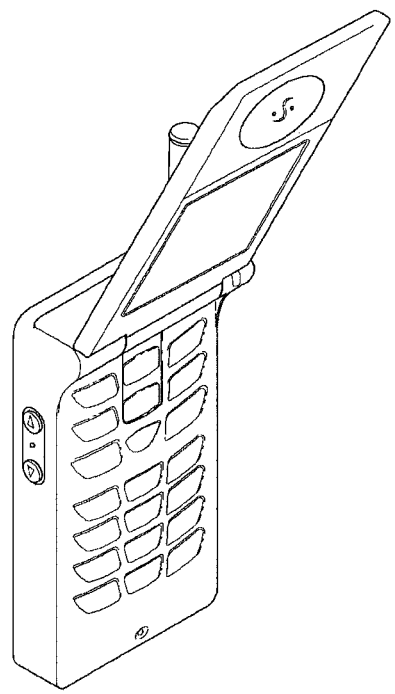
FIG. 29 is a perspective view of an electronic device employing a PoP in accordance with an eighth example embodiment of the inventive concepts.

FIG. 29 is a perspective view of an electronic device employing a PoP in accordance with an eighth example embodiment of the inventive concepts.

Referring to FIG. 29, a PoP similar to that described with reference to FIGS. 1 to 26 may be applied to an electronic device 2000 such as a mobile phone. Since the PoP is advantageous for reduction in size and improvement in performance, the electronic device 2000 simultaneously performing various functions becomes lightweight and compact. The electronic device 2000 is not limited to the mobile phone shown in FIG. 29, but includes various electronic devices such as a mobile electronic device, a laptop computer, a mobile computer, a portable multimedia player (PMP), an MP3 player, a camcorder, a web tablet, a wireless phone, a navigation device, a PDA, etc.

Ninth Embodiment

Figure 30:
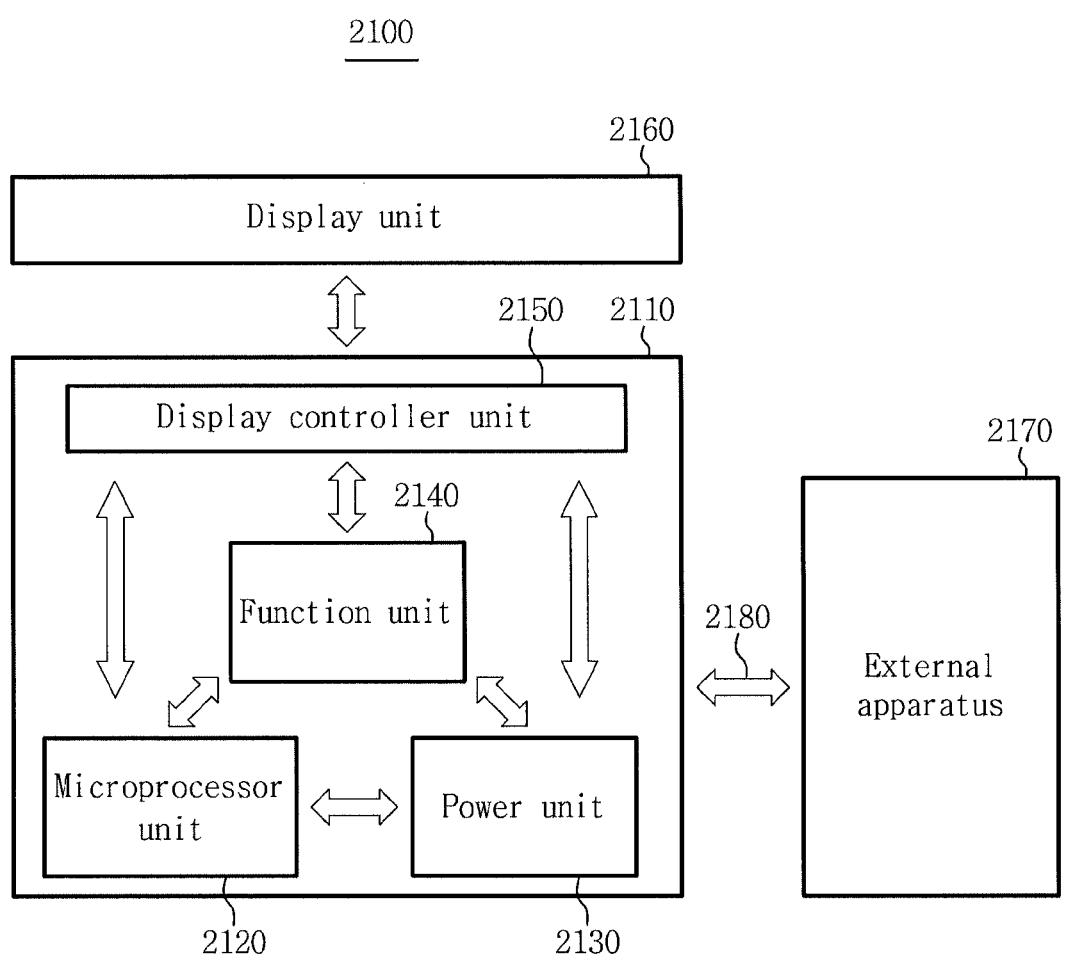
FIG. 30 is a system block diagram of an electronic device employing a PoP in accordance with a ninth example embodiment of the inventive concepts.

FIG. 30 is a system block diagram of an electronic device employing a PoP in accordance with a ninth example embodiment of the inventive concepts.

Referring to FIG. 30, a PoP similar to that described with reference to FIGS. 1 to 26 may be applied to an electronic system 2100. The electronic system 2100 may include a body 2110, a microprocessor unit 2120, a power unit 2130, a function unit 2140, and a display controller unit 2150. The body 2110 may include a mother board formed of a printed circuit board, and the microprocessor unit 2120, the power unit 2130, the function unit 2140, and the display controller unit 2150 may be mounted on the body 2110. The display unit 2160 may be disposed in the body 2119 or on a surface of the body 2110. For example, the display unit 2160 may be disposed on the surface of the body 2110 to display an image processed by the display control unit 2150.

The power unit 2130 may function to receive a certain voltage from an external battery (not shown), etc., distribute the voltage into required voltage levels, and supply the voltage levels to the microprocessor unit 2120, the function unit 2140, the display controller unit 2150, etc.

The microprocessor unit 2120 may receive a voltage from the power unit 2130 to control the function unit 2140 and the display unit 2160. The function unit 2140 may perform various functions of the electronic system 2100. For example, when the electronic system 2100 is a mobile phone, the function unit 2140 may include various elements that can perform functions of the mobile phone such as dialing, image output to the display unit 2160 through communication with an external apparatus 2170, sound output to a speaker, etc. When the electronic system 2100 includes a camera, the function unit 2140 may be a camera image processor.

For example, when the electronic system 2100 is connected to a memory card, etc., to expand the capacity thereof, the function unit 2140 may be a memory card controller. The function unit 2140 may communicate with the external apparatus 2170 through a wired or wireless communication unit 2180. Further, when the electronic system 2100 requires a universal serial bus (USB) to expand functions, the function unit 2140 may be an interface controller.

The PoP similar to that described with reference to FIGS. 1 to 26 may be applied to at least one of the microprocessor unit 2120 and the function unit 2140. For example, the external connection terminals 43, the board connection terminals 47, and the lower connection terminals 49 may be connected to a bond finger formed at the body 2110.

As can be seen from the foregoing, an encapsulant covering a wafer is formed using a wafer level molding process, and the encapsulant and semiconductor chips are divided to form a plurality of semiconductor packages. Another semiconductor package is stacked on one selected from the semiconductor packages. The other semiconductor package is electrically connected to TSVs. The semiconductor packages may have substantially the same width as the semiconductor chips. The other semiconductor package may have a width equal to or smaller than that of one selected from the semiconductor packages. Further, the other semiconductor package may have a larger width than that of one selected from the semiconductor packages. Eventually, it is possible to remarkably reduce the size of a PoP in comparison with the conventional art, and improve reliability thereof through the wafer level molding process.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages. Accordingly, all such modifications are intended to be included within the scope of the inventive concepts as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed example embodiments, as well as other embodiments, are intended to be included within the scope of the appended claims.

What is claimed is:

1. A semiconductor package, comprising:
   a first semiconductor package, the first semiconductor package including a first semiconductor chip having a plurality of through silicon vias (TSVs) extending therethrough, a plurality of internal connection terminals in a form of a conductive bump or a solder ball on the plurality of TSVs, and an encapsulant on the first semiconductor chip and the plurality of internal connection terminals, the encapsulant including a plurality of openings corresponding to the plurality of interconnection terminals; and
   a second semiconductor package on the first semiconductor package, the second semiconductor package including a second semiconductor chip and a plurality of external connection terminals, the plurality of—external connection terminals protruding into the openings to electrically connect the first semiconductor chip to the second semiconductor chip,
   wherein a sidewall of the encapsulant is coplanar with a sidewall of the first semiconductor chip.

2. The semiconductor package of claim 1, wherein the encapsulant has a same width as the first semiconductor chip.

3. The semiconductor package of claim 1, wherein the openings are aligned with the plurality of TSVs.

4. The semiconductor package of claim 1, wherein the first semiconductor chip comprises a re-distribution layer electrically connected to the TSVs and at least one of the openings is aligned with the re-distribution layer.

5. The semiconductor package of claim 1, wherein the encapsulant comprises an epoxy molding compound (EMC) or an underfill material.

6. The semiconductor package of claim 1, wherein the encapsulant is disposed on upper and lower surfaces of the first semiconductor chip.

7. The semiconductor package of claim 1, further comprising:
   a printed circuit board to a lower part of the first semiconductor package, wherein the printed circuit board has a width one of equal to and smaller than that of a width of the first semiconductor package, and the second semiconductor package is electrically connected to the printed circuit board via the plurality of TSVs.

8. The semiconductor package of claim 1, wherein the internal connection terminals are in contact with the plurality of external connection terminals.

9. The semiconductor package of claim 8, wherein a top of the internal connection terminals is lower than a top of the encapsulant.

10. The semiconductor package of claim 1, wherein the sidewall of the encapsulant does not extend beyond the sidewall of the first semiconductor chip.

11. The semiconductor package of claim 1, wherein the sidewall of the encapsulant is defined at a plane, the plane defined by extending the sidewall of the first semiconductor chip.

12. The semiconductor package of claim 1, wherein the sidewall of the encapsulant covers a top surface of the first semiconductor chip, leaving the sidewall of the first semiconductor chip exposed.

13. A semiconductor package, comprising:
   a first semiconductor package, the first semiconductor package including a first semiconductor chip having a plurality of TSVs extending therethrough, a plurality of internal connection terminals in a form of a conductive bump or a solder ball on the Plurality of TSVs, and an encapsulant on at least one of an upper surface and a lower surface of the first semiconductor chip and the plurality of internal connection terminals, the encapsulant including a plurality of openings corresponding to the plurality of interconnection terminals; and
   a second semiconductor package on the first semiconductor package, the second semiconductor package including a second semiconductor chip and a plurality of external connection terminals, the plurality of external connection terminals protruding into the plurality of openings to electrically connect the first semiconductor chip to the second semiconductor chip,
   wherein a sidewall of the encapsulant is coplanar with a sidewall of the first semiconductor chip.

* * * * *